United States Patent [19]
Talieh et al.

[11] Patent Number: 5,171,412
[45] Date of Patent: Dec. 15, 1992

[54] MATERIAL DEPOSITION METHOD FOR INTEGRATED CIRCUIT MANUFACTURING

[75] Inventors: Homoyoun Talieh, Sunnyvale; Avi Tepman, Cupertino; Hoa Thi Kieu, Sunnyvale; Chien-Rhone Wang, Milpitas, all of Calif.

[73] Assignee: Applied Materials, Inc., Santa Clara, Calif.

[21] Appl. No.: 749,096

[22] Filed: Aug. 23, 1991

[51] Int. Cl.⁵ ............................................. C23C 14/34
[52] U.S. Cl. ......................... 204/192.15; 204/192.17; 204/298.11
[58] Field of Search ...................... 204/192.12, 192.15, 204/192.17, 192.3, 298.11, 298.25, 298.26

[56] References Cited

U.S. PATENT DOCUMENTS

| | | | |
|---|---|---|---|
| 4,724,060 | 2/1988 | Sakata et al. | 204/298.11 |
| 4,756,810 | 7/1988 | Lamont, Jr. et al. | 204/192.3 |
| 4,765,815 | 7/1988 | Turner et al. | 204/298.25 |
| 4,816,126 | 3/1989 | Kamoshida et al. | 204/192.3 |
| 4,824,544 | 4/1989 | Mikalesen et al. | 204/192.12 X |
| 4,851,101 | 7/1989 | Hutchinson | 204/298.25 X |
| 4,994,162 | 2/1991 | Armstrong et al. | 204/192.12 X |

FOREIGN PATENT DOCUMENTS

| | | | |
|---|---|---|---|
| 75514 | 4/1986 | Japan | 204/298.11 |
| 310965 | 12/1988 | Japan | 204/298.11 |

*Primary Examiner*—Nam X. Nguyen
*Attorney, Agent, or Firm*—Rosenblum, Parish & Isaacs

[57] ABSTRACT

The improved material deposition process of the present invention utilizes a first, low temperature deposition step followed by a second, high temperature/high power deposition step. In the first deposition step a collimation plate is placed between the sputtering target and the substrate, such that a collimated stream of sputtered material is deposited upon the substrate. The collimated stream provides a seed layer which aids in eliminating voids by partially filling the holes and grooves in the surface of the substrate. The second deposition step is conducted as a high temperature sputtering deposition. At the high temperature the sputtered material joins and flows with the seed layer, whereby the holes and grooves are more easily filled without voids and an improved planarized layer is achieved.

21 Claims, 1 Drawing Sheet

MATERIAL DEPOSITION METHOD FOR INTEGRATED CIRCUIT MANUFACTURING

BACKGROUND OF THE INVENTION

1. Field of the Invention

The present invention relates generally to methods for depositing materials upon a semiconductor substrate, and more particularly to a two step deposition process wherein the first step includes a collimated relatively low temperature sputtering process and the second step utilizes a standard high temperature sputtering process.

2. Brief Description of the Prior Art

A standard process step in the manufacturing of integrated circuits involves the deposition of a metallic layer upon the surface of a wafer. Typically, the wafer surface has been previously etched in a plurality of locations, whereby the surface contains holes and grooves and is therefore not planar. It is the goal of the deposition step to uniformly and completely fill the holes and grooves and to achieve a generally planar outer surface after deposition has occurred. However, it is difficult to completely fill the holes and grooves, such that no voids exist. As is well known, the existence of voids can result in poor performance and defective devices. In an attempt to solve this problem, the prior art utilizes a deposition substrate temperature of approximately the melting point of the deposition material (approximately 450 degrees C. for aluminum) such that the deposited layer will tend to flow and completely fill the holes and grooves. The success of this process relies to a great extent upon the achievement of a uniform temperature throughout the substrate, such that the deposition and flow of the deposited material is substantially uniform and controlled. However, achieving a uniform temperature throughout the substrate requires rigorous temperature controls and can be difficult and time consuming.

SUMMARY OF THE INVENTION

The improved material deposition method of the present invention utilizes a first, low temperature deposition step followed by a second, high temperature deposition step. In the first deposition step a collimated stream of sputtered material is deposited upon the substrate. The collimated material provides a first layer which aids in filling the holes and grooves in the surface of the substrate. The second deposition step is conducted as a high temperature sputtering deposition. At the high temperature the sputtered material joins and flows with the first layer, whereby the holes and grooves are more easily filled, such that voids are eliminated and an improved planarized layer is achieved.

It is an advantage of the present invention that it provides an improved material deposition process that does not require rigorous temperature controls.

It is another advantage of the present invention that it provides an improved material deposition process that includes a first collimated low temperature deposition step and a second higher temperature step.

It is a further advantage of the present invention that it provides an improved material deposition process wherein a collimation plate is utilized in a first deposition step, such that the holes and grooves in the surface of the substrate are coated with a substantial first layer, whereby the occurrence of voids is reduced and a more uniform second layer may be deposited thereon.

These and other objects, features and advantages of the present invention will no doubt become apparent to those of ordinary skilled in the art after having read the following detailed description of the preferred embodiments which are illustrated in the several figures of the drawing.

IN THE DRAWING

DETAILED DESCRIPTION OF THE PREFERRED EMBODIMENTS

Figure 1:
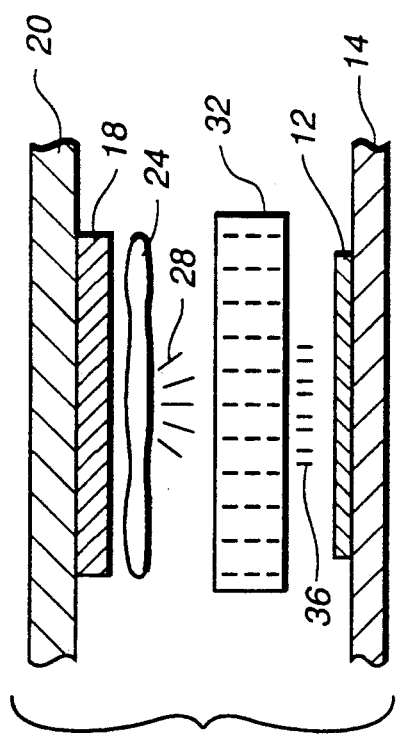
FIG. 1 is a side elevational view depicting the first step of the deposition process of the present invention.
Figure 2:
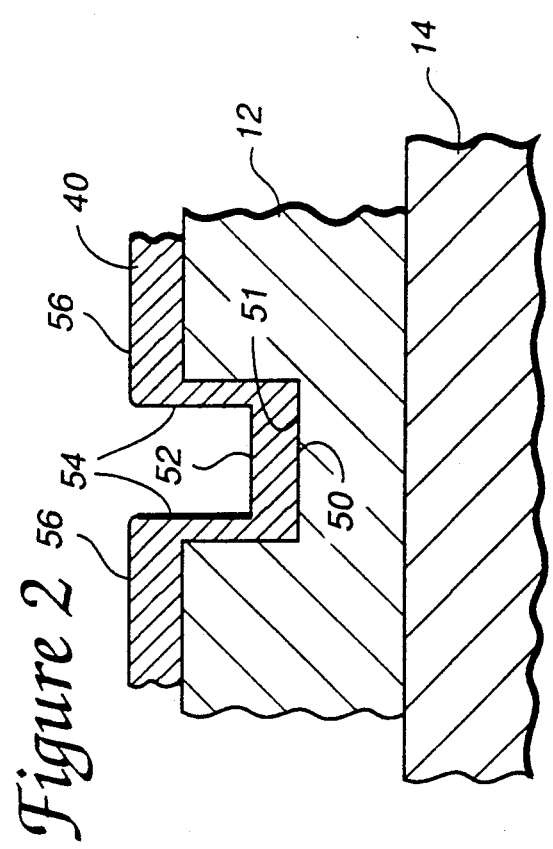
FIG. 2 is a side cross-sectional view depicting the substrate of the first deposition step of the present invention.

The present invention involves a two step deposition process which results in improved void filling and outer surface planarization in the deposition of materials upon a semiconductor substrate. FIGS. 1 and 2 are depictions related to the first deposition step. As depicted in FIGS. 1 and 2, a substrate 12 is held in position upon a suitable support 14. A target 18 is held upon a second support 20 and a plasma 24 is struck proximate the surface of the target 18, such that target material 28 is sputtered from the surface of the target 18 by the plasma 24. As depicted in FIG. 1, the sputtered material 28 projects away from the target surface 18 in random directions. A collimation plate 32 is disposed between the target 18 and the substrate 12, and held in place by a suitable support structure (not shown). The collimation plate 32 is disposed away from the plasma 24, such that the edges of the plate 32 are not exposed to the plasma.

The collimation plate 32 includes a plurality of holes divided by thin, parallel walls, such that only sputtered material that is travelling from the target in a direction that is generally parallel to the walls will pass through the plate, such as material 36. While a broad range of dimensions of collimation plates may be utilized in the present invention, suitable results may be obtained with a honeycomb plate wherein the walls have a height of approximately 0.75 inches and the holes have a width at their widest point of approximately one-half inch, whereby the collimation plate has an aspect ratio (length/width) of approximately 1.5. The collimation plate 32 may be composed of any material that is suitable for the environmental conditions within the deposition chamber, including aluminum and stainless steel.

FIG. 2 is a close-up cross-sectional depiction of the substrate 12 following the first deposition step. As is depicted in FIG. 2, it is the purpose of the first deposition step to provide a seed layer 40 that is deposited upon the surface of the substrate 12. As is well known to those knowledgeable in the art related to the fabrication of integrated circuits, the surface of the substrate 12 will typically contain a plurality of holes and grooves, such as groove 50 shown in cross-sectional view in FIG. 2. The seed layer 40, owing to its collimated nature will form a thicker layer 52 on the bottom surface 51 of the groove 50 and a thinner layer 54 along the sides of the groove 50. The layer 56 outside of the groove will tend to have a thickness that is greater than the thickness 52 within the bottom of the groove 50. It is therefore to be understood that the collimated deposition layer 52 serves to substantially cover the bottom surface 51 of the groove 50 and to assure complete contact of the deposited material 52 with the bottom surface 51 of the groove 50. It is not necessary nor desired that the first layer 40 be heated to a temperature sufficient for it to flow, whereby the first deposition step may be conducted at a low temperature, such as from room temperature to approximately 100 degrees centigrade. Higher temperatures, short of the deposition material flow temperature could also be utilized, although it is not necessary to utilize such temperatures in the first step.

Figure 3:
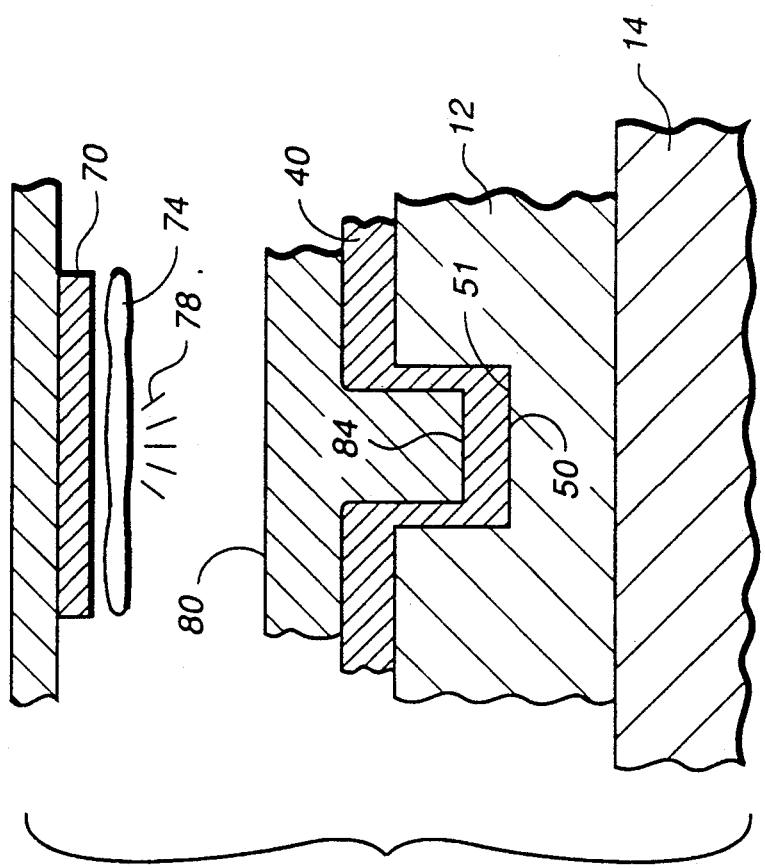
FIG. 3 is a side cross-sectional view depicting the second deposition step of the present invention and the resulting substrate.

The second step of the deposition process is generally depicted in FIG. 3. This second deposition step is preferably, although not necessarily, conducted in a different chamber from the first deposition step, and is conducted in a similar manner to the prior art deposition processes. It is to be understood that FIG. 3 depicts the substrate 12 in a close-up, cross-sectional view similar to FIG. 2, whereas the target and plasma of FIG. 3 are depicted in a side elevational view similar to FIG. 1. As depicted in FIG. 3, a target 70 composed of a suitable deposition material is sputtered by a plasma 74, such that deposition material 78 projects in random directions therefrom. The deposition material 78 is deposited in a layer 80 on top of the layer 40 that was created in the first deposition step. As is generally practiced in the art, the temperature of the second deposition step is approximately the flow temperature of the second deposition material, such that the second deposition layer tends to flow into the irregularities, such as the groove 84 in the layer 40 which mirrors the groove 50 in the substrate. The flow of the second deposition material layer 80 therefore fills the groove 84 and results in an improved overall deposition of combined layers 40 and 80 within the groove 50 of the substrate 12.

It is therefore to be understood that the first deposition step, utilizing a collimated first layer assures that the bottom surface 51 of the groove 50 will be thoroughly coated with the deposition material. This feature is significant where the bottom surface 51 is a contact for an electrical connection. Owing to the temperature and power utilized in the second deposition step, the second deposition layer may both flow and grow into the first deposition layer, whereby the presence of voids in the grooves is substantially reduced and an improved overall deposited layer results.

In the preferred embodiment deposition procedure the deposition material for both the first deposition step and the second deposition step is aluminum. The first deposition step was conducted in a first chamber at a temperature of approximately 50 degrees centigrade, a pressure of 2 mTorr, a power of 9 kw for 140 seconds which produced a first layer thickness within the holes and grooves of approximately 1200 angstroms at the bottom 51 of the grooves. The second deposition step was conducted in a second chamber as a three part process wherein the first part was conducted at a starting temperature of approximately 50 degrees centigrade increasing to approximately 150 degrees centigrade, at a pressure of 4.0 mTorr, a power of 2 kw for 30 seconds, followed by a second part wherein the substrate heater was turned on to rapidly ramp up the wafer temperature to approximately 450 degrees centigrade, at a pressure of 4.0 mTorr, a power of 2 kw for 30 seconds, such that the deposition thickness of the second layer following the first two parts was approximately 2,600 angstroms. Thereafter, with the temperature and pressure remaining the same, the power was raised to 9 kw for 25 seconds, whereupon an additional layer of 5,000 angstroms was deposited. The temperature and power utilized in the third part of the second deposition step are sufficient to cause the material deposited in the second layer to flow into the holes and grooves to fill them and result in a generally planer outer surface. Additionally, the aluminum in the first layer tended to grow and bond with the aluminum deposited in the second layer. However, the invention is not to be so limited to two identical materials. Specifically, the material of the first layer may be titanium, or any other suitable material. Likewise, the material of the second layer may be other than aluminum, and the process temperature and power that is utilized in at least one part of the second step will be approximately the flow temperature and power parameters of the second material.

While the invention has been particularly shown and described with reference to certain preferred embodiments, it will be understood by those skilled in the art that various alterations and modifications in form and detail may be made therein. Accordingly, it is intended that the following claims cover all such alterations and modifications as may fall within the true spirit and scope of the invention.

What I claim is:

1. A process for the deposition of materials upon a substrate, comprising the steps of:
   depositing a collimated first layer of a first material upon a substrate;
   depositing a second layer of a second material upon said first layer; and
   treating said second material to cause it to flow upon said first layer, whereby a planarized surface is formed.

2. A process as described in claim 1 wherein said first layer is deposited at a relatively low temperature and said second layer is deposited at approximately the flow temperature of said second material.

3. A process as described in claim 1 wherein said first material is the same as said second material.

4. A process as described in claim 3 wherein said first material and said second material are aluminum.

5. A process as described in claim 4 wherein said first layer is deposited at a relatively low temperature and said second layer is deposited at approximately at the flow temperature of aluminum.

6. A process as described in claim 1 wherein said collimated first layer is created by the steps of:
   sputtering said first material;
   passing said sputtered first material through a collimation plate; and
   depositing said sputtered material that passes through said collimation plate upon said substrate.

7. A process as described in claim 6 wherein said collimation plate has an aspect ratio of approximately 1.5.

8. A process for depositing materials upon a substrate comprising the steps of:
   depositing a collimated first layer of a first material upon said substrate, including the steps of:
   sputtering said first material from a target; and
   passing said sputtered first material through a collimation plate prior to the deposition thereof upon said substrate;
   depositing a second layer of a second material upon said first layer of said substrate by sputtering said second material from a target to deposit said second material upon said first layer; and treating said second material to cause it to flow upon said first layer, whereby a planarized surface is formed.

9. A process as described in claim 8 wherein said first layer is deposited at a relatively low temperature and said second layer is deposited at approximately the flow temperature of said second material.

10. A process as described in claim 8 wherein said first material is the same as said second material.

11. A process as described in claim 10 wherein said first material and said second material are aluminum.

12. A process as described in claim 11 wherein said first layer is deposited at a relatively low temperature and said second layer is deposited at approximately at the flow temperature of aluminum.

13. A process as described in claim 8 wherein said collimation plate has an aspect ratio of approximately 1.5.

14. A process for depositing layers of materials upon the surface of an integrated circuit wafer, comprising the steps of:

affixing said wafer to a support structure within a processing chamber;

affixing a sputtering first target of a first material to a support structure within said processing chamber;

affixing a collimation plate to a support structure within said processing chamber, whereby said collimation plate is disposed between said target and said wafer;

striking a plasma proximate the surface of said first target, such that the material comprising said first target is sputtered therefrom, whereby portions of said sputtered material will pass through said collimation plate to form a collimated first deposited layer of said first material upon said wafer;

affixing said wafer with said first deposited layer thereon to a support structure within a second layer processing chamber;

affixing a second target of a second material to a support structure within said second layer processing chamber;

heating said wafer to a temperature approximating the flow temperature of said second target material;

striking a plasma within said second layer processing chamber proximate the surface of said second target to sputter said second target material therefrom;

whereby said sputtered second target material will form a planarized second deposited layer upon said first layer of said wafer.

15. A process as described in claim 14 wherein said first target material is the same as said second target material.

16. A process as described in claim 15 wherein said first material and said second material are aluminum.

17. A process as described in claim 16 wherein said first layer is deposited at a relatively low temperature and said second layer is deposited at approximately at the flow temperature of aluminum.

18. A process as described in claim 14 wherein said collimation plate has an aspect ratio of approximately 1.5.

19. A process as described in claim 14 wherein said first deposited layer and said second deposited layer are both deposited in the same processing chamber.

20. A process as described in claim 19 wherein the same target is utilized to create said first deposited layer and said second deposited layer.

21. A process as described in claim 14 wherein said first deposited layer is deposited in a first processing chamber and said second deposited layer is deposited in a second processing chamber.

* * * * *